United States Patent [19]
Davis et al.

[11] Patent Number: 5,885,400
[45] Date of Patent: Mar. 23, 1999

[54] METHOD FOR JOINING RIGID SUBSTRATES AT ABUTTING LATERAL EDGES

[75] Inventors: George W. Davis, Santa Clara; Charles F. Hurst, Campbell; Michael A. Sprauve, San Jose, all of Calif.

[73] Assignee: Xerox Corporation, Stamford, Conn.

[21] Appl. No.: 853,962

[22] Filed: May 9, 1997

Related U.S. Application Data

[60] Provisional application No. 60/033,580 Dec. 20, 1996.
[51] Int. Cl.$^6$ .................................................. H05K 3/36
[52] U.S. Cl. ............................................ 156/304.3; 29/830
[58] Field of Search ................................ 156/157, 304.3, 156/304.7; 29/830

[56] References Cited

U.S. PATENT DOCUMENTS

| | | | |
|---|---|---|---|
| 3,533,891 | 10/1970 | Puyear | 156/304.3 |
| 3,650,872 | 3/1972 | McKiernan | 156/304.3 |
| 3,693,185 | 9/1972 | Lloyd | 346/139 C |
| 3,793,107 | 2/1974 | Lloyd | 156/174 |
| 4,315,270 | 2/1982 | Lloyd et al. | 346/155 |
| 4,569,584 | 2/1986 | St. John et al. | 355/14 R |
| 5,024,114 | 6/1991 | Braden | 174/52.4 |
| 5,237,346 | 8/1993 | Da Costa et al. | 346/155 |

*Primary Examiner*—Francis J. Lorin

[57] ABSTRACT

A method of joining substrates at their lateral edges uses an elongated stiffening member to provide the requisite rigidity and strength for the application in which the joined substrate is to be used. The joining method is useful in any type of application that shares three functional requirements: The joined substrate sections must produce a unitary substrate construction with sufficient rigidity and strength to maintain the substrate sections in a joined position during a subsequent processing operation on the unitary substrate and thereafter when a completed assembly composed of joined substrates is installed as a component of another apparatus. Secondly, if components are formed on a substrate prior to joining, the integrity of those components must remain intact and uncontaminated during the joining process in a manner that would permit a subsequent operation to successfully use the components. Thirdly, the joint between the abutting lateral edges of two substrate sections must be both of sufficient strength for the intended purpose of the unitary substrate construction and have a width controllable within a range of widths comprising an acceptable tolerance allowed for a distance between two adjacent components that occur at the joint. The method is illustrated in the context of a writing head for use in an electrographic marking device, where the writing head may be manufactured to any desirable width by using the method of the present invention to join head member sections to form a working substrate, prior to attaching the conductors thereto that form the nib line.

7 Claims, 14 Drawing Sheets

METHOD FOR JOINING RIGID SUBSTRATES AT ABUTTING LATERAL EDGES

CROSS REFERENCE TO RELATED APPLICATIONS

This regular application claims priority from Application No. 60/033,580, which is a provisional application entitled "Method for Joining Substrates", filed on Dec. 20, 1996, which provisional application is hereby incorporated by reference herein as if set out in fall. Aspects of the present invention have been disclosed in certain commonly assigned U.S. patent applications, which have one or more inventors in common with the subject application, which were filed concurrently with the above-referenced provisional application, and which have the following application numbers and titles: Application No. 08/778,163, entitled "Electrostatic Writing Head Having Integral Conductive Pads"; Application No. 08/771,407, entitled "Electrostatic Writing Head Having A Head Member Of Multiple Joined Sections"; and Application No. 08/770,309, entitled "Method Of Manufacture Of An Electrostatic Writing Head Having Integral Conductive Pads".

BACKGROUND OF THE INVENTION

The present invention relates generally to a method for joining rigid substrates at abutting lateral edges to form a unitary substrate. Though not restricted to any particular use, the method is illustrated herein in the context of manufacturing a writing head for use in an electrographic marking device; the writing head has a head member comprised of multiple joined sections that are joined according to this method.

In an electrographic marking device, an exemplary writing head comprises a plurality of writing electrodes physically positioned to electrically address a dielectric surface of the medium as the medium travels through the writing station. An aligned series of backup electrodes is positioned opposite to the writing electrodes of the writing head in a manner that leaves a small gap, and the medium on which the image is to be formed passes through this gap. When the potential difference between the addressed writing electrodes and the opposed backup electrodes is raised to a threshold level of several hundreds of volts, referred to as the Paschen breakdown point, an electrostatic charge is deposited on the dielectric portion of the medium as that medium is moved through the gap. The timing and sequencing of energization of the electrodes provides for electrical charging of selected areas of the medium to form a desired latent image as the medium is moved through the writing station.

When the image to be formed on the medium is considered to be structured as a two-dimensional array of rows and columns of image spots, the latent image is typically formed row by row (or column by column), requiring the writing head to contain a writing electrode, referred to as a "nib" herein, for each spot to be formed in a row (or column) of the image. Thus, the writing head must be as wide as the visible image desired, which is typically related to the width of the medium, and the nibs must be as closely spaced as necessary to form a visible image having the desired resolution while still being able to be independently controlled. The closely spaced nibs form a line referred to as the "nib line" of the writing head; each row of the latent image produced by the nib line is referred to as a "scan line" of the image.

U.S. Pat. Nos. 3,693,185 and 3,793,107, issued to Lloyd, (hereafter also referred to as the Lloyd patents) disclose a method of construction of an electrostatic writing head that involves winding a length of wire about a mandrel to form uniformly laterally spaced convolutions of wire. An elongated strip of insulating material that is coated with a hardenable adhesive material extends transversely to the plane of the uniformly spaced wire convolutions and is positioned beneath them. This coated strip, which ultimately forms a first head member of the writing head, is then moved radially outwardly of the convolutions to urge the adhesive material against portions of the convolutions. Then another strip of insulating material is adhered to the convolutions in confronting relation to the first named strip so as to sandwich portions of the convolutions between the confronting strips. The strips are then compressed tightly together and after permitting the adhesive material to harden, the convolutions and strips are severed by cutting through both the strips and the convolutions along a line extending lengthwise of the strips; each of the two lines of wire tips exposed by the cutting operation forms the nib line of a writing head.

Writing heads may be made in a variety of widths using this process, which provides flexibility for producing multiple smaller-width writing heads from a single winding. For wide image marking requirements, however, such as for devices that support engineering, architecture and graphic arts applications, the writing heads are typically made in single, full-width units. The maximum width of a nib line is subject to the capabilities of the winding apparatus, and considerable retooling of equipment would be required to enlarge the width.

Thus, it is apparent that there is a manufacturing limitation with respect to producing writing heads of varying widths according to the process disclosed in U.S. Pat. Nos. 3,693,185 and 3,793,107 and having the structural configuration shown therein.

SUMMARY OF THE INVENTION

The present invention is based on the observation that the novel writing head invention of application Ser. Nos. 08/778,163 and 08/771,407, with its nib line formed from conductors that are connected to, or "stitched", to integral conductive pads, could be made even more flexible in its design if there were a low-cost manufacturing method of making the writing heads in a variety of widths. The present invention is premised on the discovery that the first head member of a writing head may be composed of individual head member sections that are joined prior to the stitching of the conductors. This enables a writing head to be made in a wide variety of lengths, such as for example a 54 inch length, with very few limitations.

To accommodate embodiments of the writing head that make use of rows of conductive pads that are offset from each other, each individual head member section to be joined to another may have a lateral edge of a specific contour to ensure that each row of conductive pads is spaced across the gap formed by abutting two lateral edges to provide a pad in the proper position for bonding conductors in the spaced parallel relationship they require. Increased interpad spacing and increased pad width allow for the cut of this lateral edge contour to vary from exactly half the interpad distance and to be within a predetermined tolerance and still maintain the proper conductor spacing.

The process of joining head member sections has been tailored to the precise requirements of the sections being joined. It is important for the complete unitary first head member composed of joined sections to have the necessary rigidity and strength to function as a writing head in the electrostatic marking device. Thus, the joints at joined edges must be strong. The joining process itself must not contaminate the conductive pads in any way that would prevent electrical charge from flowing to the conductors. The joining process disclosed uses a stiffening member and a hardenable adhesive material as a joining material that is applied in a manner that protects the conductive pads from damage.

Therefore, in accordance with one aspect of the present invention, a method is provided for joining first and second rigid substrates at abutting lateral edges to form a unitary substrate construction. The method comprises removably mounting first and second rigid substrates lengthwise in fixed positions on a first working surface. A first rigid substrate is spaced apart from a second rigid substrate on the working surface by a predetermined fixed distance between the abutting lateral edges thereof. The predetermined fixed distance form a gap that becomes the joint between the two joined sections. The method further comprises applying a hardenable adhesive material to a first surface of an elongated stiffening member having a length sufficient to span across the gap formed between the abutting lateral edges and at least a portion of each rigid substrate adjacent to a respective one of the abutting lateral edges. The first surface of the elongated stiffening member with the hardenable adhesive applied thereto is then brought into contact with the first and second rigid substrates mounted on the first working surface such that the elongated stiffening member spans the gap formed between the abutting lateral edges and the portion of each rigid substrate adjacent to a abutting lateral edge. The hardenable adhesive material applied to the first surface of the elongated stiffening member is sufficiently fluid to flow along the gap formed between the abutting lateral edges when the elongated stiffening member is brought into contact with the first and second rigid substrates mounted on the first working surface. The hardenable adhesive material is then dried to a solid state. The elongated stiffening member is permanently affixed to the first and second rigid substrates, and the hardenable adhesive material forms a surface along the gap formed between the abutting lateral edges. The surface connects the first and second rigid substrates into the unitary substrate construction. The unitary substrate construction with the elongated stiffening member attached thereto is then removed from the first working surface.

The novel features that are considered characteristic of the present invention are particularly and specifically set forth in the appended claims. The invention itself, however, with respect to its structure, method of construction and method of operation, together with its advantages, will best be understood from the following description when read in connection with the accompanying drawings. In the Figures, the same numbers have been used to denote the same component parts or steps. The description of the invention includes certain terminology that is specifically defined for describing the embodiment of the claimed invention illustrated in the accompanying drawings. These defined terms have the meanings indicated throughout this specification and in the claims, rather than any meanings that may occur in other sources, such as, for example, documents, if any, that are incorporated by reference herein elsewhere in this description.

DETAILED DESCRIPTION OF THE INVENTION

A. Structural Description of the Writing Head.

The following terminology and basic principles are helpful in understanding the electrographic writing head described herein. The "pitch" of an electrographic writing head is exactly the same as the desired resolution of the image to be produced; image resolution is described in terms of "spots", or dots, per inch of the medium, as measured in both the horizontal x, or width, dimension and the vertical y, or height, dimension. The pitch of the writing head is a function of the width, or diameter, of the bare wire used to produce the electrically charged spots on the medium, an expected growth factor of each spot of charge, given the characteristics of the wire and the type of charge used, and the desired overlap between the spots. These characteristics can be summarized as follows:

$$\text{bare wire width} + \text{expected growth factor} = \text{spot size}$$

$$\text{pitch} = \frac{1}{\text{spotsize} - \text{overlap}}.$$

and $$\text{spot size} - \text{overlap} = \frac{1}{\text{pitch}}.$$

Thus, the size of the bare wire to be used and its spacing with respect to adjacent wires can be computed as a function of the desired pitch of the writing head. These basic principles permit numerous variations and combinations of writing head structures.

1. An Electrostatic Writing Head Having Integral Conductive Pads.

Figure 1:
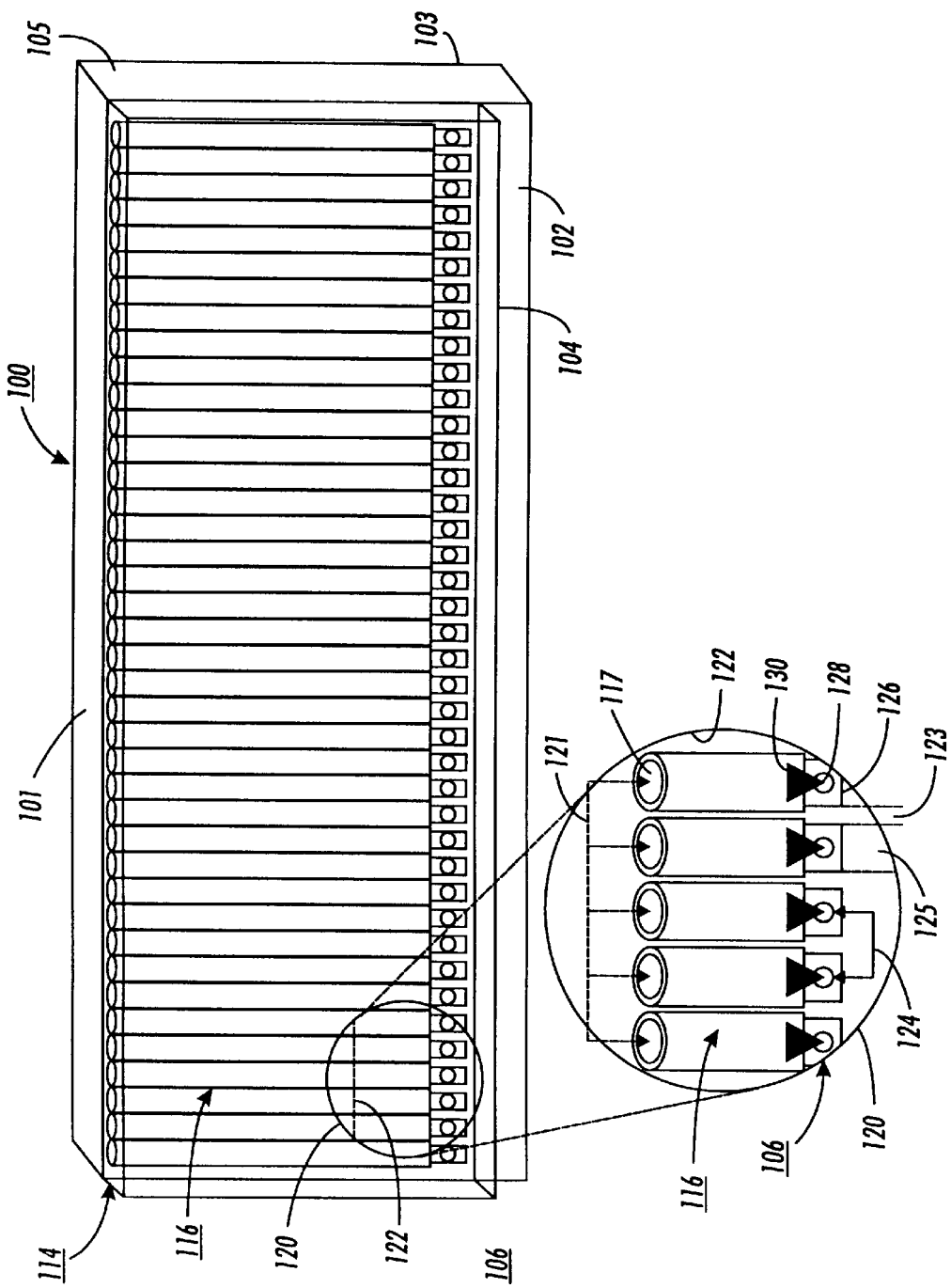
FIG. 1 is a schematic front perspective view of a writing head for use in an electrographic marking device, showing conductors attached to integral conductive pads and an enlarged detailed view of the placement of the conductors.

FIG. 1 shows writing head 100 in a basic embodiment. First head member 101, positioned at the back of FIG. 1, and second head member 104, positioned in the forefront of FIG. 1, are elongated, insulating rigid or semi-rigid members secured together in a confronting relationship in order to encapsulate a set of conductors 116, or writing electrodes, positioned in spaced parallel relation on first head member 101. Head member 101 may be made of any suitable insulating material; a fiber glass material known as FR4 or G10 is an example of a suitable material. One or both of the head members may be formed of a liquid material that then hardens into a suitable rigid insulating layer. In particular, second head member 104 may be formed of a liquid epoxy that is applied after writing electrodes 116 are positioned on first head member 110; the epoxy then hardens in a manner that secures conductors 116 in position on the top surface of head member 10, so as to make writing head 100 of substantially unitary construction. Note that second head member 104 is shown as being transparent solely for purposes of viewing the component parts of writing head 100, and it is understood that second head member 104 need not be made of a transparent material.

Figure 2:
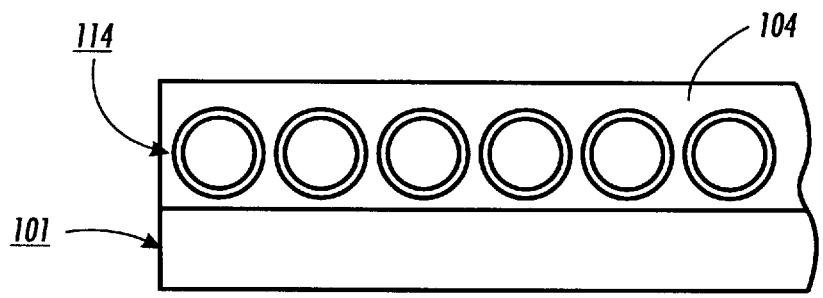
FIG. 2 is a schematic top view of a portion of the writing head of FIG. 1 showing a portion of the nib line formed by the conductors.

One end of each of the writing electrodes 116, referred to as a nib, form nib line 114, which is partially exposed at the top edge of writing head 100, and which is the end of the writing electrodes that deposit charge on the dielectric medium (not shown) on which the image is to be formed during the writing process. FIG. 2 illustrates a portion of writing head 100 from a view of the top edge thereof, showing nib line 114 encapsulated between first and second head members 101 and 104, respectively. As noted earlier, when a single nib deposits a charge on a medium during the recording or writing process, the charge forms a single spot of foreground color in the final image formed on the medium, and the number of nibs in nib line 114 is directly related to the resolution of the image formed. Conductors 116 may be made of any suitable type of wire, such as nickel, silver, copper, gold and aluminum.

With reference again to FIG. 1, for purposes of identifying the location of its components, first head member 101 may be described as having a top region near the top edge of head member 101 and a bottom region near the bottom edge of member 101. First head member 101 also has a top surface 102 and a bottom surface 103. Writing head 100 further includes a row 106 of conductive pads positioned in the bottom region of top surface 102 of first head member 101. Conductive pads 106 serve as the junction point of conductors 116 and the electronic circuitry (not shown) that energizes the writing head. Cutaway portion 120 shows a portion of the top surface 102 enlarged to show the details of conductive pads 106 and the connections of writing electrodes 116 to the pads. Each conductive pad 126 comprises a small conductive region permanently attached to top surface 102, and having an opening 128, referred to as a conductive via, positioned on the surface of the pad.

Figure 3:
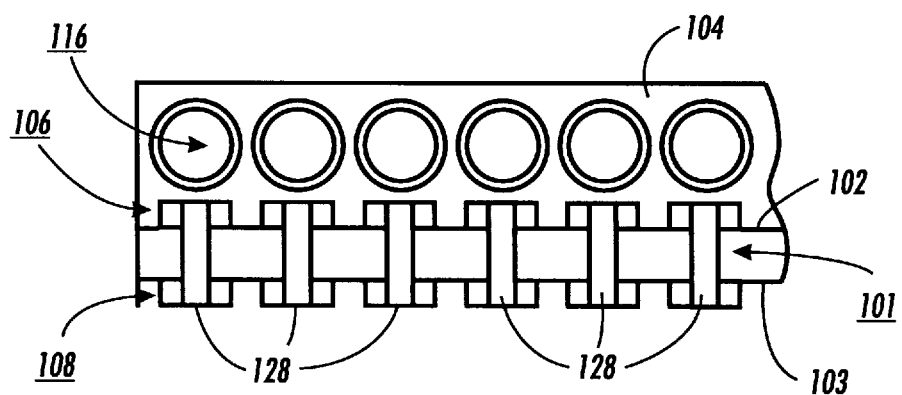
FIG. 3 is a schematic bottom view of a section of the writing head of FIG. 1 as cut transversely through the center of the row of conductive pads, showing the top and bottom surface conductive pads.

FIG. 3 illustrates a view of a portion of writing head 100 from its bottom edge. First head member 101 is shown as having conductive pads 106 on top surface 102, with conductors 116 positioned on the surfaces of respective pads and encapsulated by second head member 104. A second set of conductive pads 108 is permanently attached to bottom surface 103 of first head member 101, each in a paired positional relationship with one of the first set of conductive pads 106 to allow each conductive via 128 to extend completely through a conductive pad attached to top surface 102 and through a paired conductive pad attached to bottom surface 103 of first head member 101. Each conductive pad in one of the sets of conductive pads 106 and 108 is the same size as others in the set. However, pads in one set may, but need not, be sized differently from pads in the other set, as shown in the figure.

The surface of each conductive pad 106 must be of the type to allow for the permanent attachment of one end of each of conductors 116; cutaway portion 120 of FIG. 1 shows that each one of conductors 116 is permanently attached to a respective pad 126 by a suitable bonding process represented as black triangle 130. Conductive pads 106 and 108 and vias 128 may each be made of copper or a similar material of the type that conducts an electrical charge to conductor 117. Conductive pads 106 and 108 with conductive vias 128 may be fabricated using conventional plated hole-through technology used in the fabrication of printed circuit boards. This process is described in more detailed below.

With continued reference to cutaway portion 120 of FIG. 1, the pitch of writing head 100 in the configuration shown in FIG. 1 is limited by the capabilities of printed circuit board technology at this time. Conductive pads 106 have a width 125 and are spaced a fixed distance 123 apart on top surface 102. Existing printed circuit board technology allows for the etching of pads having a ten millimeter (10 mils) width and an interpad spacing of three to five millimeters (3–5 mils). Assuming a minimum total pad-plus interpad spacing of 13 mils, writing head 100 has a maximum pitch of between seventy-five and eighty (75–80) spots per inch Each conductor 117 must each be positioned on top surface 102 to fall on a respective conductive pad 126. When center-to-center distance 124 between pairs of adjacent conductive vias 128 is 13 mils, center to center positioning 121 of adjacent wires must be 13 mils; the size of the wire that may be used, computed using the image formation characteristics described above, is constrained by these measurements.

The conductive pads that serve as the junction mechanism between the writing head and the writing head driver circuitry in the embodiment of FIG. 1 may be arranged in a variety of configurations on first head member 101. These variations provide flexibility in designing a writing head of varying pitch; as will be described further below, these variations also provide flexibility in designing a writing head of varying width, or length.

Figure 4:
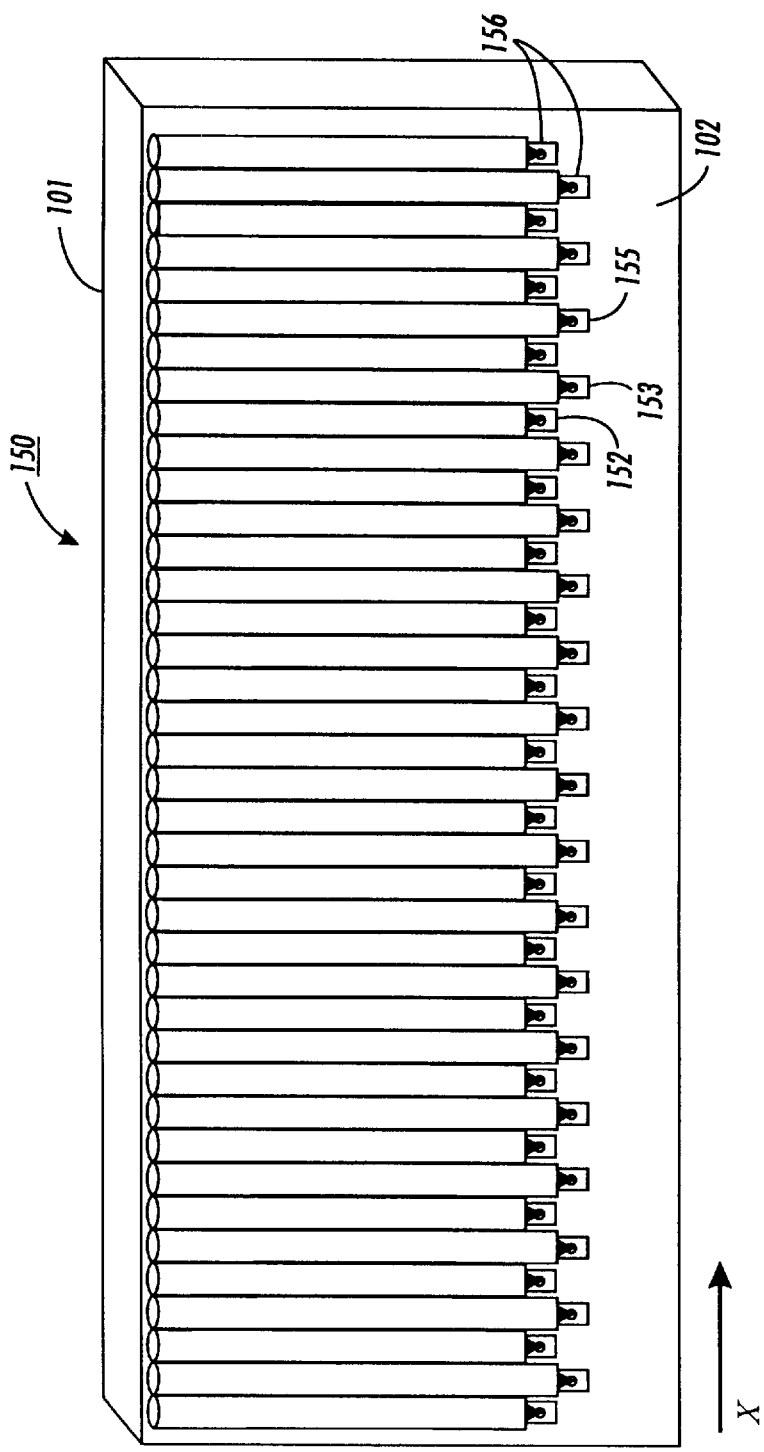
FIG. 4 is a schematic perspective front view of the first head member of the writing head of FIG. 1 showing an alternative arrangement of the conductive pads in two offset rows.

FIG. 4 shows writing head 150 which has two rows 156 of conductive pads. With the exception of the various arrangements of the conductive pads in two rows that are described below, all other characteristics and properties of writing head 150 are the same as those described for writing head 100 illustrated in FIG. 1. Rows 156 of conductive pads may be configured in different arrangements where every other pad in the single row 106 of conductive pads of FIG. 1 is positioned in a second row of pads positioned below single row 106, towards the bottom edge of first head member 101. For ease of reference, pads adjacent to each other in the same row, such as pads 153 and 155, are referred to as "adjacent pads"; conductive pads that are consecutively positioned with respect to the x direction of top surface 102 of first head member 101, regardless of what row they are in, are referred to as "consecutive pads". Conductive pads 152 and 153 are examples of consecutive pads.

The design of writing head 150 of FIG. 4 having a pad arrangement with two offset rows of conductive pads may allow for a writing head of increased pitch as compared to the embodiment of the writing head shown in FIG. 1. In general, the pitch of writing head 150 is further increased by adding conductors connected to one or more additional rows of conductive pads in which the pads in each row are offset from a row positioned above or below it in a manner that maintains a fixed center-to-center spacing between consecutive conductive pads.

Figure 5:
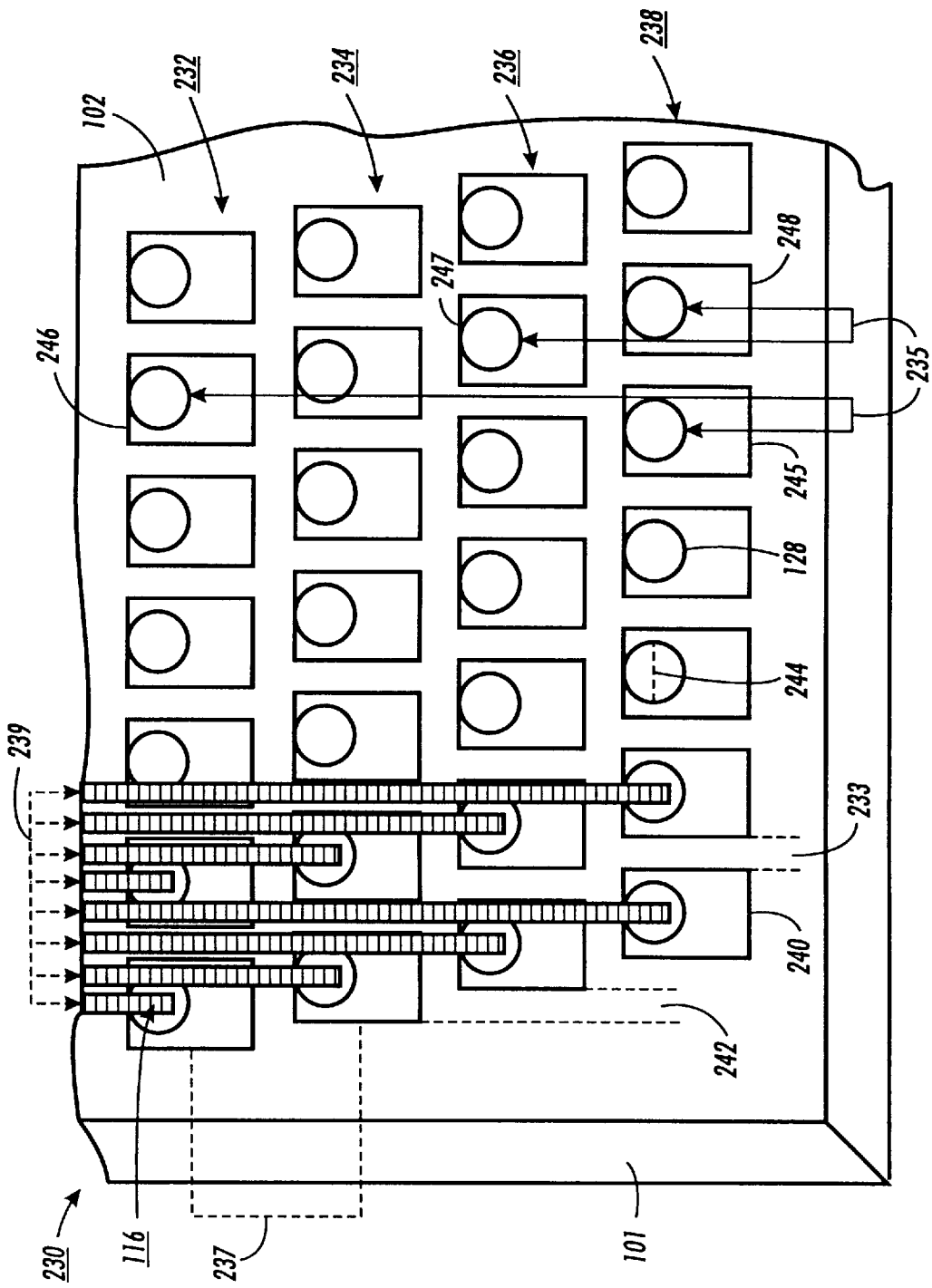
FIG. 5 is a perspective front view of a portion of the first head member of the writing head showing an arrangement of conductive pads and conductors in four offset rows.

FIG. 5 illustrates a portion of writing head 230 having conductors 116 attached to conductive pads arranged in four offset rows of conductive pads 232, 234, 236 and 238. A conductive pad in any one of rows 234, 236 and 238 is offset from the prior consecutive conductive pad positioned in the row above it by fixed distance 242 which is equivalent to the center-to-center spacing 239 of the conductors, and which is also equivalent to $$\frac{1}{pitch}.$$

Fixed offset distance 242 along the x-axis causes the conductive pads in each row to maintain a consistent interpad distance 233 and center-to-center spacing 235 between consecutive conductive pads, such as shown in FIG. 5 between consecutive conductive pads 245 and 246 and between consecutive pads 247 and 248. Conductors 116 are each connected in consecutive order to a respective consecutive conductive pad such that every fourth conductor is connected to a respective conductive pad in the same row; this type of connection pattern is referred to herein as "an alternating conductor arrangement".

Each conductor of conductors 116 must make electrical contact only with the conductive pad it is attached to, and therefore must be insulated from, or prevented from contact with, conductive pads in other rows that it may be positioned over. If the pitch of the writing head permits a larger diameter wire, insulated wire may be used for all wires to prevent electrical shorting. Alternatively, one or more insulated spacers may be placed between the top surface 102 of first head member 101 and conductors 116 to space conductors 116 from surface 102. Such insulating spacers extend the length of substrate 200 such that all conductors 116 pass over the spacers and are positioned in a middle region of top surface 102 during the manufacturing process. Each spacer has a diameter sufficient to lift the conductors that are attached to conductive pads in the fourth (lowest, or last) row of pads away from top surface 102 and away from conductive pads in the first three rows of pads that these conductors pass over, in order to maintain an acceptable gap above those pads, thereby preventing any one conductor of conductors 116 from coming into electrical contact with a conductive pad over which it is positioned as a result of its connection to its respective conductive pad.

With continued reference to FIG. 5, in an embodiment of writing head 230 that has been constructed, each conductive pad 240 has dimensions of 20 mils wide by 40 miles long and has a conductive via 128 having diameter 244 of 14.5 mils. Conductive pads are positioned 6 mils apart in a single row, creating a center-to-center spacing of 26.6 mils between adjacent pads in a row. Each row of conductive pads is positioned 10 mils from the row above or below it, which creates a center-to-center distance 237 between conductive pads in different rows of 50 mils in the y, or vertical, direction with respect to top surface 102 of head member 101. Offset distance 242, and center-to-center distance 239 between conductors, is 6.6 mils, resulting in a writing head having a pitch of $$\frac{1}{6.6 mils},$$

or approximately 150 spots per inch. Insulating spacers are used in this embodiment and each has a diameter of 14 mils, which is sufficient to maintain the minimum gap necessary between a conductor and conductive pads in other rows positioned under it to avoid electrical shorting.

2. A Writing Head With Multiple Rows of Nib Lines and Multiple Rows of Offset Conductive Pads.

Figure 6:
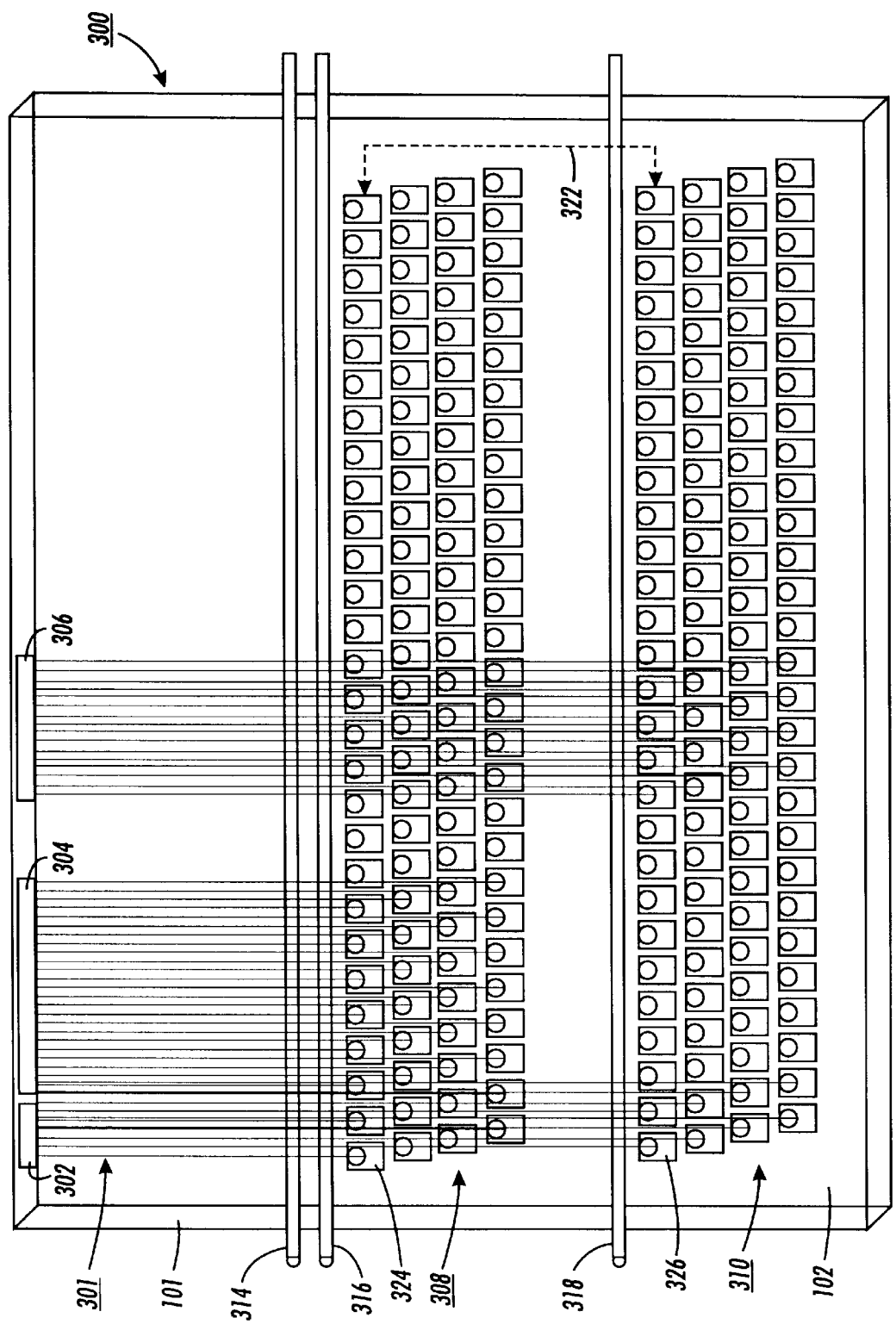
FIG. 6 is a diagrammatic perspective front view of the first head member of an embodiment of the writing head showing the connection pattern of conductors to conductive pads.

FIG. 6 shows first head member 101 of writing head 300, which is shown as incomplete in order to illustrate features of connecting the conductors to the conductive pads. For purposes of illustrating the arrangement and connections of the conductors, the conductors shown in FIG. 6 are labeled as three groups 302, 304 and 306. Two sets 308 and 310 of four offset rows of conductive pads are attached to top surface 102 of head member 101; sets 308 and 310 are separated by vertical distance 322. Group 302 of conductors are shown attached to conductive pads in both sets 308 and 310 of pads; group 302 of conductors illustrates the appearance of a completed configuration of conductors when all conductors are attached to conductive pads on head member 101. Group 304 of conductors are attached to conductive pads only in set 308 of conductive pads, in an alternating conductor arrangement as previously shown in FIG. 5, group 306 of conductors are attached to conductive pads only in set 310 of conductive pads.

Two insulating spacers 316 and 318 are positioned on top surface 102 of head member 101; spacer 316 creates a gap between top surface 102 and conductors attached to conductive pads in first set 308 of conductive pads, and spacer 318 creates a gap between top surface 102 and conductors attached to conductive pads in second set 318 of conductive pads. Spacers 316 and 318 perform the function of preventing conductors from having contact with conductive pads over which they are positioned but to which they are not attached.

Also shown in FIG. 6 is insulating spacer 314 which is positioned on top of all conductors attached to set 308 of conductive pads, including all conductors in group 304 and those conductors in group 302 that are attached to conductive pads in set 308. Insulating spacer 314 serves the function of forming two rows of nibs in the nib line of writing head 300 by separating the conductors into two sets that lie in distinct and separate planes, conductors attached to set 308 of conductive pads lie in a first plane and conductors attached to set 310 of conductive pads lie in a second plane parallel to the first plane.

Nib line 301 of writing head 300 has two rows of nibs offset from each other. Note that in FIG. 6 insulating spacers 314, 316 and 318 are shown as all having the same size for illustrative purposes only; the size of spacer 314 is related to the image forming factors of pitch, expected growth and spot overlap that are described above; the size of spacers 316 and 318 is related to a minimum size needed to achieve the proper gap between the conductive pads and conductors. Note that the insulating spacers in FIG. 6 are not necessarily drawn to show their actual scale with respect to the conductors and conductive pads. Each row of conductive pads in each set 308 and 310 of pads is offset from the row above it by a first fixed distance. In order to produce nib line 301 having the first row of nibs offset from the second row of nibs, the first pad 326 in set 310 of conductive pads is offset from first pad 324 in set 308 of conductive pads by a second fixed distance, which is approximately half of the first fixed distance.

Figure 7:
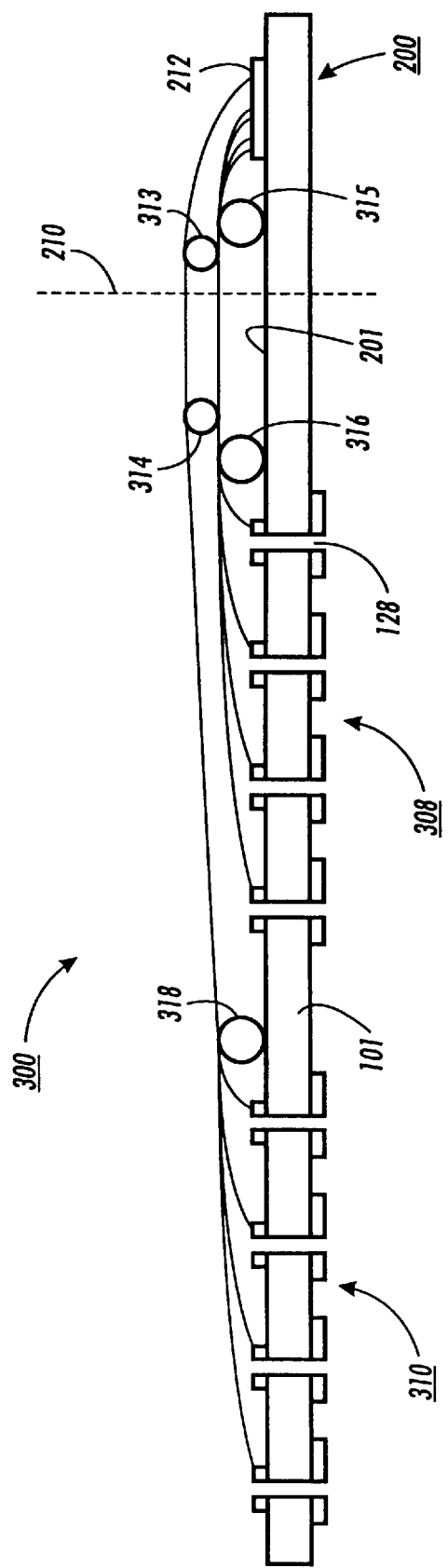
FIG. 7 is a side view of the working substrate used to produce the first head section of the writing head of FIG. 6, taken laterally through the first head member at a line passing through group 302 of conductors, showing the placement of the insulating spacers.

FIG. 7 is a side view of what is referred to herein as a "working substrate" 200 of head member 101 of writing head 300 during the manufacture process. The term "substrate" is used in its ordinary English meaning to refer to a substratum, or underlying layer, of head member 101 to which the conductive pads, conductors and spacers are attached or added. FIG. 7 illustrates the placement of spacers 316 and 318. An additional insulating spacer 313 is positioned above cut line 210 (at the right of the figure) during manufacture of writing head 300 in order to cause the conductors to line in a plane substantially parallel to top surface 201 of substrate 200 in the region near cut line 210 where the nib line is formed. FIG. 7 also shows the positioning of insulating spacer 314 and its companion spacer 313 positioned above cut line 210.

When writing head 300 is constructed using the exemplary dimensions given above with respect to the conductive pad arrangement shown in FIG. 5, each of the two sets of conductors attached to sets 308 and 310 of conductive pads, respectively, produces a row of nibs having a pitch of approximately 150 spots per inch. In combination, the two rows of nibs produce a single nib line having a pitch of 300 spots per inch. The offset distance between a first pad in a first row of pads and the first pad in the row immediately below the first row of pads is 6.6 mils, as it was in the exemplary dimensions given for the conductor arrangement of FIG. 5. The embodiment of FIG. 6 uses 39–40 gauge nickel wire having a diameter of from 3.3–3.6 mils. Insulating spacers 315, 316 and 318 (FIG. 7) have a diameter of 14 mils, and insulating spacers 313 and 314 (FIG. 7) have a diameter of 4 mils. In addition, second set 310 of conductors is attached to surface 102 of head member 101 a distance 322 (FIGS. 6 and 7) of 430 mils below first set 308 of conductive pads.

3. A Writing Head Composed of Joined Writing Head Sections.

The writing head as illustrated by the various embodiments has an overall length (or width) dimension (as measured in the x direction shown in FIG. 4) that is theoretically limited only by the ability to manufacture first head member 101 with the conductive pads attached. Printed circuit board (PCB) technology is used to form the conductive pads on a working substrate that becomes head member 101, and limitations may exist in current PCB technology that determine the length of the substrate that may be used. The capability to produce longer writing heads than can be currently manufactured, or a desired reduction in manufacturing costs, or both, can be attained by constructing the writing head of the present invention to a desired length from individual smaller sections that have been joined together. This involves constructing the working substrate that forms the unitary first head member, from which the writing head will be manufactured, from individual joined sections before attaching the conductors to the head member. Thus, the individual sections must be joined in such a way as to maintain certain parameters of the arrangement of the conductive pads.

In particular, with reference to FIGS. 1 and 3, multiple sections of head member 101 with conductive pads 106 and 108 attached to top and bottom surfaces 102 and 103, respectively, may be joined together by a process described below to form a head member of the desired length before conductors 116 are attached to the conductive pads. The key to joining individual head member sections is to preserve the center-to-center spacing 124 (FIG. 1) between adjacent conductive pads in the same row within a certain predetermined and acceptable tolerance.

With respect to embodiments of the writing head that have a single row of conductive pads, as illustrated in FIG. 1, or multiple rows of conductive pads that are not offset, preparing each end of two head members 101 for joining requires a straight cut through each head member along its width dimension (the dimension parallel with the lengthwise extent of the conductors); this cut produces an edge much like that of edge 105 shown in FIG. 1, but the cut is positioned a distance away from the last (or first) conductive pad that is half of the distance between the conductive pads, within a certain predetermined acceptable tolerance, such that when joined, the center-to-center spacing between the last conductive pad on the first head member and the first conductive pad on the second head member is substantially maintained. It will be appreciated that joining sections of head member 101 of FIG. 1 when configured with conductive pads spaced at a minimal interpad distance of 3 mils apart requires extremely tight tolerances in making this straight cut; moreover, if the smallest conductive pads of 10 mils are used, this allows little or no margin of error in the placement of the conductive pads when the conductors are attached, since the small pads require that each conductor be accurately placed for attachment. However, in embodiments of the writing head of FIG. 1 having a lower pitch and using larger pads with increased interpad spacing, joining head member sections by the method described below is a very satisfactory solution to the problem of producing longer writing heads.

The use of multiple offset rows of conductive pads that have an increased interpad spacing in the pad arrangement significantly facilitates the joining process by reducing the precision required, and thereby increasing the predetermined tolerances allowed, to cut the end of a first head member for joining with the end of a second head member. While it is desirable to maintain the center-to-center spacing between adjacent pads that occur across the gap produced by the joining process, using an increased pad size only requires that the second of two adjacent pads that occur at the gap of two joined sections is positioned so that a conductor may be bonded to some part of the surface of the pad. Thus the center-to-center spacing of these adjacent pads that occur at a gap may not be exactly the same as the center-to-center spacing of a first and second adjacent pads that occur remote from the gap, but that spacing is within a predetermined, acceptable tolerance that allows for a conductor to land on the pad for bonding thereto. This allowable acceptable tolerance in the cuts made at the lateral edges of the substrates to be joined allows for head members to be constructed of virtually any length.

Figure 8:
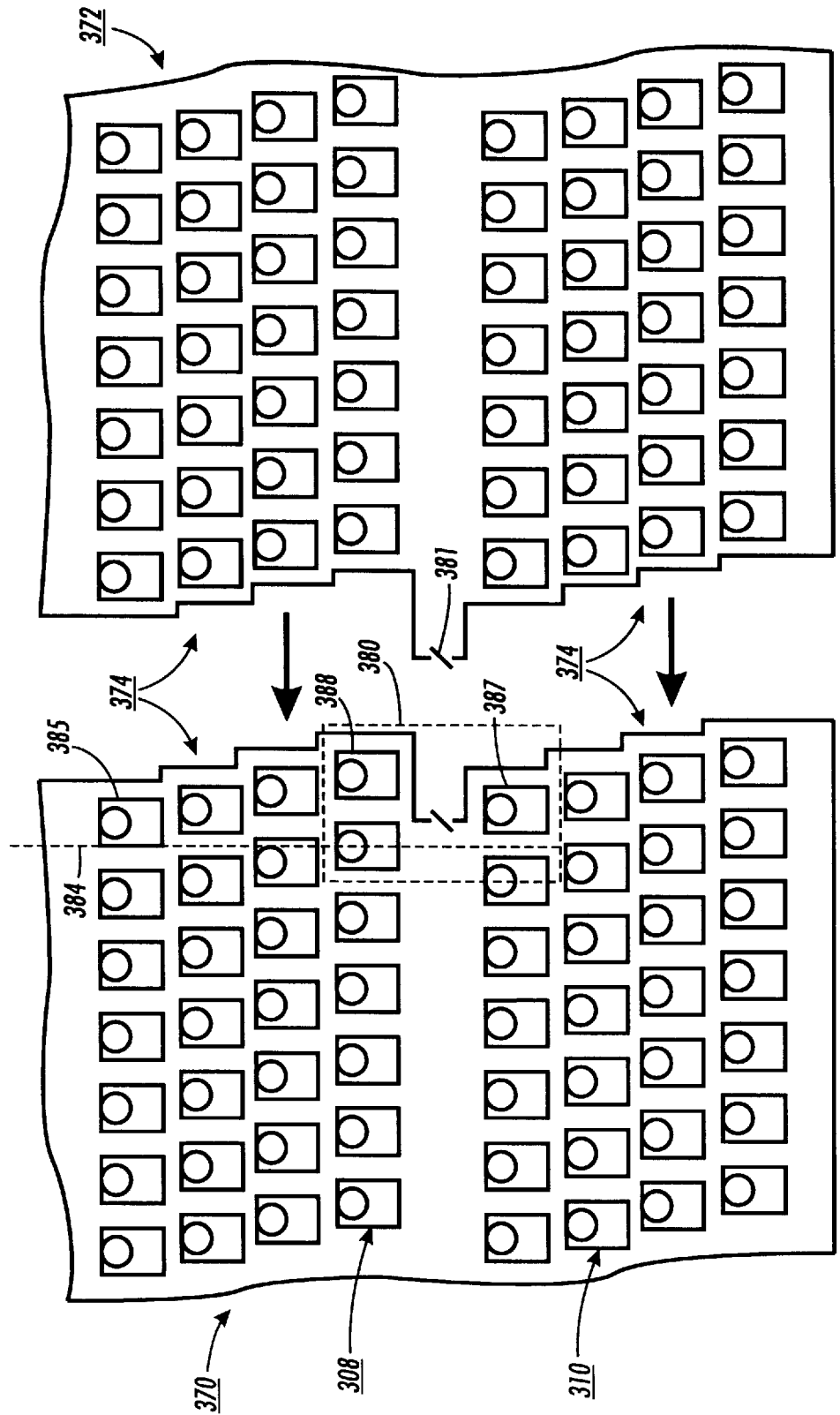
FIG. 8 diagrammatically illustrates the stepped cut of the edges of head member sections that are joined according to the method of the present invention to form a unitary first head member of the writing head, according to the embodiment shown in FIG. 22 and the method shown in FIG. 12.

FIG. 8 is a partial front view of two portions 370 and 372 of two head member sections of writing head 300 of FIG. 6. Each head member has two sets 308 and 310 of four offset rows of conductive pads. The vertical distance between sets 308 and 310 is shortened in comparison to the distance shown in FIG. 6, to make the figure more compact; the shortened distance is indicated by line 381 in FIG. 8. The end of each head member that is to be joined to an end of another head member is cut in a stepped cut 374 that follows the contour of the offset arrangement of the pads. Since these lateral ends of the head members have the same cut and shape, and since they fit together in a complementary fashion, these ends are referred to herein as complementary abutting lateral edges of head member sections 370 and 372 when these edges are joined.

Figure 9:
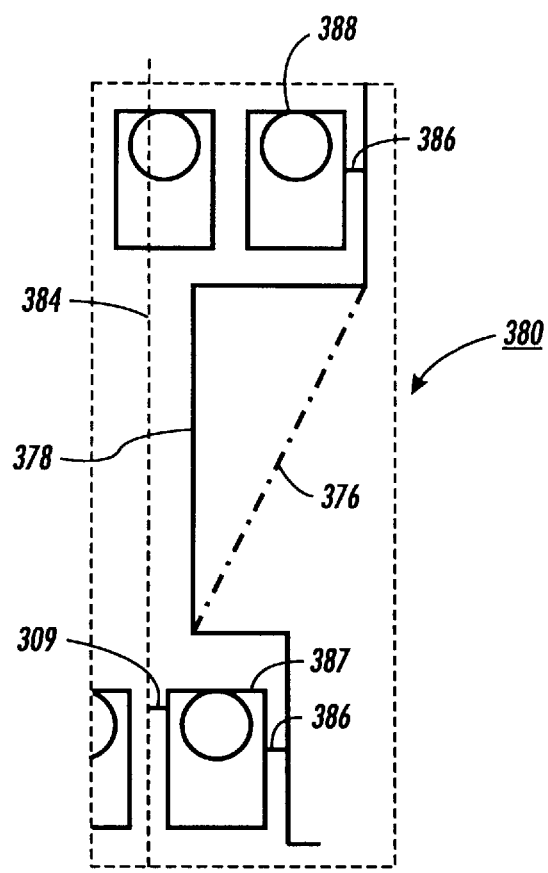
FIG. 9 illustrates an enlarged portion of FIG. 8 showing measurement relationships that illustrate predetermined tolerances for making the stepped cut of FIG. 8.

Rectangular region 380 is enlarged in FIG. 9 to illustrate the distances that are of interest in computing the predetermined tolerances at the edges and for making stepped cut 374; the distance between the two sets of conductive pads is shown expanded in FIG. 9. It can be seen in FIG. 8 that dashed line 384 aligns with conductive pad 385 which is the last pad in the first row of set 308 of conductive pads. First pad 387 in the first row of pads in set 310 of conductive pads is offset by distance 309 from conductive pad 385. Stepped cut 374 is preferably made at a distance 386 from the last pad in each row of pads; distance 386 is half of the interpad distance between the pads and may vary by a predetermined tolerance that is computed to allow a conductor having a fixed parallel spacing from a previous consecutive conductor to land on the next consecutive pad that occurs over the gap of the joint. Thus, in the case of connecting conductors to four offset rows of pads, the next adjacent conductive pad that occurs on the other side of a gap formed by joining two sections is actually the fourth consecutive conductor to be bonded; the predetermined tolerance that is allowed in distance 386 is a function of the pad size and the pitch of the writing head that accumulates over the span of these four consecutive conductors.

Note also in FIG. 9 that the cut 378 between the last row of pads in set 308 of conductive pads and the first row of conductors in set 310 of conductive pads is typically not an important consideration in shaping the cut of the lateral edges for joining. Cut 376 is an equally acceptable cut to use to form the contour of the complementary abutting lateral edges.

In an embodiment of a writing head with joined head member sections constructed according to the dimensions and measurements given above with respect to writing head 230 of FIG. 5 and writing head 300 of FIG. 6, offset distance 309 is 3.3 mils and stepped cut distance 386 is 3 mils. Tolerances can be computed by taking into account the pad width of 20 mils and the interpad spacing of 6.6 mils.

Figure 10:
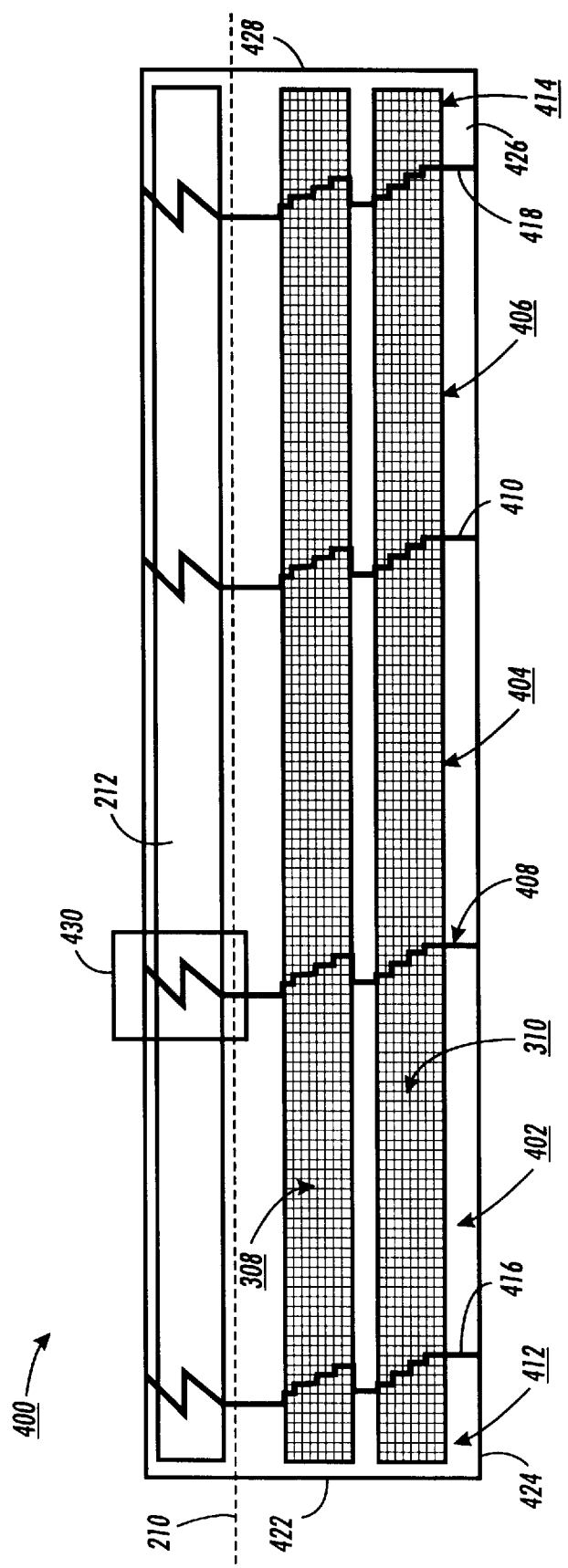
FIG. 10 is a front view of the back surface of the working substrate of a unitary first head member composed of head member sections joined together according to the method of the present invention.

FIG. 10 shows a schematic front view of substrate 400 composed of joined substrate sections 402, 404 and 406, each having the characteristics of writing head 300 of FIG. 6; substrate 400 is shown during the manufacturing process, with each substrate section 402, 404 and 406 having bonding area 212, for bonding one end of the conductors and two sets 308 and 310 of conductive pads. After all conductors have been bonded to area 212 and the second head member has been added encapsulating the conductors, substrate 400 is cut at cut line 210 to form the nib line of the writing head. Each substrate section 402, 404 and 406 includes sets 308 and 310 of conductive pads attached to its top surface; sets 308 and 310 of conductive pads are represented in FIG. 10 as cross-hatched regions without distinct features of these offset rows of conductive pads, but it is understood that these conductive pads have the configuration shown in FIG. 6. Stepped cut lines 416, 408, 410, and 418, shown as thick lines for illustration purposes, show the contour of the ends of the individual substrate sections, as described in the discussion accompanying FIG. 8. Substrate 400 also includes end cap sections 412 and 414 which are smaller in width than sections 402, 404 and 406. End cap sections 412 and 414 are used for installing the completed writing head in an electrostatic marking device; conductors are typically not attached to these sections during manufacturing other than for test purposes, and any conductors that are attached do not extend over cut line 210 and thus do not form part of the nib line of the completed writing head. End cap sections 412 and 414 are shown as simple rectangular regions but edges 422, 424, 426 and 428 may have shapes suitable for being secured to fittings in the marking device to retain the writing head in its proper position.

Figure 11:
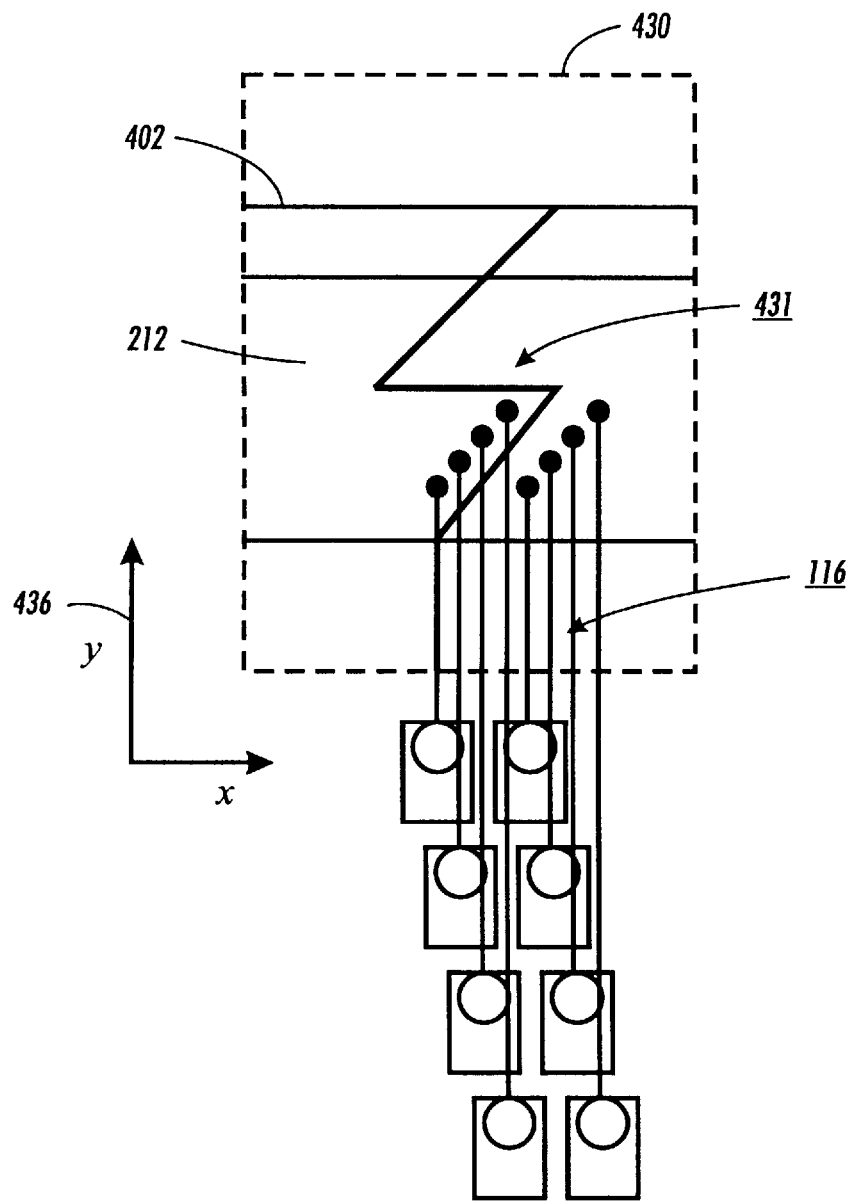
FIG. 11 illustrates an enlarged portion of FIG. 10 showing an example of a cutting pattern through bonding area 212 to accommodate the bonding of conductors thereto in a joined head member.

FIG. 11 is an enlarged view of rectangular region 430 of FIG. 10 which shows the detail of edge portion 431 of substrate 402 and 404 through bonding area 212. Also shown in FIG. 11 are conductors and conductive pads. Edge portion 431 is one of many examples of an edge configuration that is tailored to the arrangement of the conductors that results from the particular method used to bond the conductors to bonding area 212. An individual substrate section must have an edge cut through bonding area 212 that has a configuration that ensures that each conductor is bonded to an area of bonding area 212 and not to the gap formed between the head member sections that is necessarily formed during the joining process. The small gap between sections, represented as the black area of edge 431, is made of the material used for joining the sections (e.g., epoxy) and is not suitable for bonding a conductor. The actual edge configuration required depends on the manner in which the conductors are bonded to bonding area 212. In FIG. 11, one end of each of four consecutive ones of conductors 116 is bonded to bonding area 212 in a position that is an (x, y) displacement from the preceding adjacent conductor relative to axes 436; each set of four conductors forms a diagonal line of bonds, which are represented as small black circles. For this method of bonding, edge configuration 431 ensures that, for conductors positioned at the junction of two substrate sections, their ends avoid the gap region and fall in bonding area 212.

Writing head 300 illustrated in FIG. 6 may be constructed using a substrate that has the structure of substrate 400 of FIG. 10. The substrate sections with conductive pads attached are joined into a single unitary substrate 400 prior to bonding the conductors to the substrate. The joining process is described below. It can be seen that individual sections of substrates may each be cut to specific lengths and combined to form the desired length of the writing head. Or, alternatively, multiple substrate sections each having a fixed length may be combined and joined to a substrate section of a special length that together form the total writing head length desired. To form a fifty-four (54) inch writing head, for example, three fourteen (14) inch sections may be combined with a twelve (12) inch section and end cap sections. Still another alternative is to form a substrate for manufacturing a writing head from fixed length substrate sections and attach conductors only to the portion that gives the desired nib line length. It can be appreciated that a writing head constructed of individual substrate sections offers great design flexibility, and may also offer significant cost savings when constructing longer writing heads, over the construction of a writing head having a unitary working substrate.

B. Process for Making the Writing Head.

The discussion that follows describes two of the component processes for making the writing head: the process of constructing the working substrate, and the process of the present invention of joining head member sections. The process of stitching the conductors to the completed and joined working substrate is omitted, and may be found in commonly assigned application Ser. No. 08/770,309, entitled "Method Of Manufacture Of An Electrostatic Writing Head Having Integral Conductive Pads", which is hereby incorporated by reference herein as if set out in fall. After the stitching of working substrate 200 has been completed, a second elongated head member is formed from an adhesive bonding material, such as epoxy, by flowing liquid epoxy across working substrate 200, in a manner sufficient to cover the bonding areas and the conductors bonded thereto. The adhesive layer is allowed to harden to form a rigid encapsulating layer over working substrate 200 and the entire assembly is cut along cut line 210 (see e.g., FIGS. 7 and 10), thereby exposing a surface of each of the parallel conductors; these surfaces lie in at least one line and form the nib line of the writing head.

The description that follows mostly makes reference to constructing writing head 300 of FIG. 6. It is understood, however, that the process described may be adapted, without significant changes, to making any one of the illustrated embodiments of the present invention, or numerous other variations thereof.

1. Working Substrate Construction.

Figure 12:
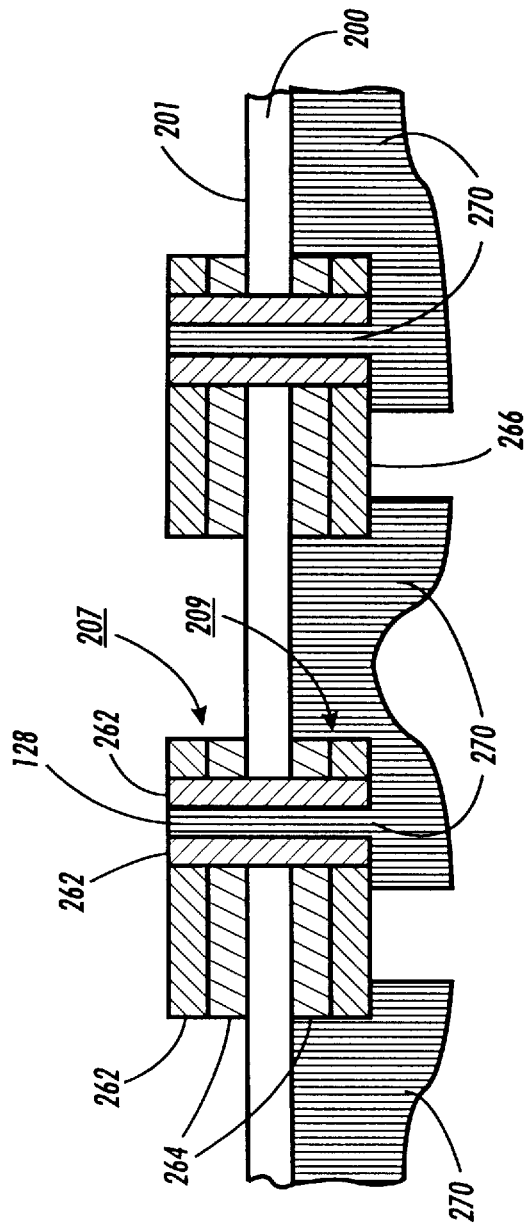
FIG. 12 illustrates a portion of the working substrate showing the surface preparation of the working substrate prior to attaching the conductors thereto.

Construction of the writing head first requires fabrication of the integral conductive pads on the working substrate using standard printed circuit board (PCB) technology. FIG. 12 illustrates a small portion of substrate 200 (FIG. 7) after completion of the conductive pads, viewed from the side of a cut perpendicular to top surface 201 through substrate 200 and through two conductive pads labeled as pads 207 and 209. An elongated substrate 200, preferably fiberglass or like material, is laminated on both sides with copper, or any other suitable conductive material, to a specified thickness, forming laminated layers 264. The total thickness of the copper that forms the conductive pads may depend on the type of bonding process used to attach the conductors to the pads. In the construction of writing head 300, one half ounce copper, which produces a plating layer of approximately 0.7 mils, is used as the initial laminate layer. The laminated substrate 200 is then drilled with holes according to the arrangement of the conductive pads desired; these holes will become the conductive vias 128. In the case of writing head 300, two sets of four offset rows of 14.5 mils holes are drilled in laminated substrate 200 each having a center-to-center distance of 26.6 mils form an adjacent hole.

A plating process then applies a second layer 262 of conductive material on top of layer 264 on top surface 201, which coats substrate 200 again and also coats the holes with copper layer 262. The thickness of this second layer determines the overall thickness of the each conductive pad, and thus may also depend on the bonding process used to attached the conductors to the pads. In the embodiment described herein of the construction of writing head 300, ultrasonic welding is used to attach the conductors to the pads; it is preferable for effectiveness of the welding process that the conductive pads have a maximum thickness no greater than 1.8 mils. Thus, the second plating layer 262 may also be of one half ounce copper. Applying a laminate bonding of one half ounce copper followed by a plating layer of one half ounce copper is referred to as "half over half" plating. The conductive pads are then etched out of copper layers 262 and 264, and excess copper is removed from both surfaces of substrate 200. Bonding area 212 (FIG. 7) is also etched out of copper layers 262 and 264 at this time on top surface 201.

In a final fabrication step, the conductive vias are filled using a liquid solder mask, a process referred to as "plugging and tenting" the vias. It is necessary for the conductive vias to be closed or filled during construction of the writing head. In particular, second head member 104 (FIG. 1) is formed by flowing a hardenable adhesive liquid such as epoxy over substrate 200 with attached conductors; the epoxy must be prevented from flowing through the conductive vias during this step. The solder mask is applied to the surface opposite surface 201 which becomes the bottom surface of substrate 200. A silk screen pattern, or mask, across the pads determines the flow of the solder mask; a portion 266 of each conductive pad is protected from the flow of solder mask by the silk screen mask, and the surrounding solder mask flow builds up in a layer 270 over the surface of substrate 200 and the unprotected regions of the conductive pads, and fills the conductive vias.

One or both edges of completed substrate 200 are then cut to the desired shape, such as stepped cut 374 of FIG. 8. These sections are then joined according to the process described below to form substrate 400 (FIG. 10) of the desired length. The completed substrate is then ready for the conductors to be attached.

2. Joining Multiple Working Substrate Sections to Form a Single Working Substrate.

A process for joining multiple working substrate sections to produce the multisection working substrate 400 of FIG. 10 has the following functional requirements. First, the working substrate sections must be joined in a manner that produces a joined working substrate with sufficient rigidity and strength to maintain the substrate sections in a joined position, both during the process of connecting (i.e., stitching) the conductors to the substrate, and thereafter when a completed writing head composed of joined head member sections is installed as a component of an electrostatic marking device. Secondly, since the conductive pads are formed on the working substrate prior to joining, the joining process must ensure that the integrity of the conductive pads remains intact; they cannot become damaged, covered over, or otherwise contaminated during the joining process, since such contamination would prevent conductors from successfully bonding to the pads. Thirdly, the type of joining material used to join the lateral edges of the substrate sections must be of the type that provides sufficient strength at the joint with a minimal amount of material. The width of the gap, or joint, between the joined lateral edges of two substrate sections must be within the range of widths that comprise the predetermined and acceptable tolerance allowed for the center-to-center distance between two adjacent conductive pads in a single row that occur at the joint.

Figure 13:
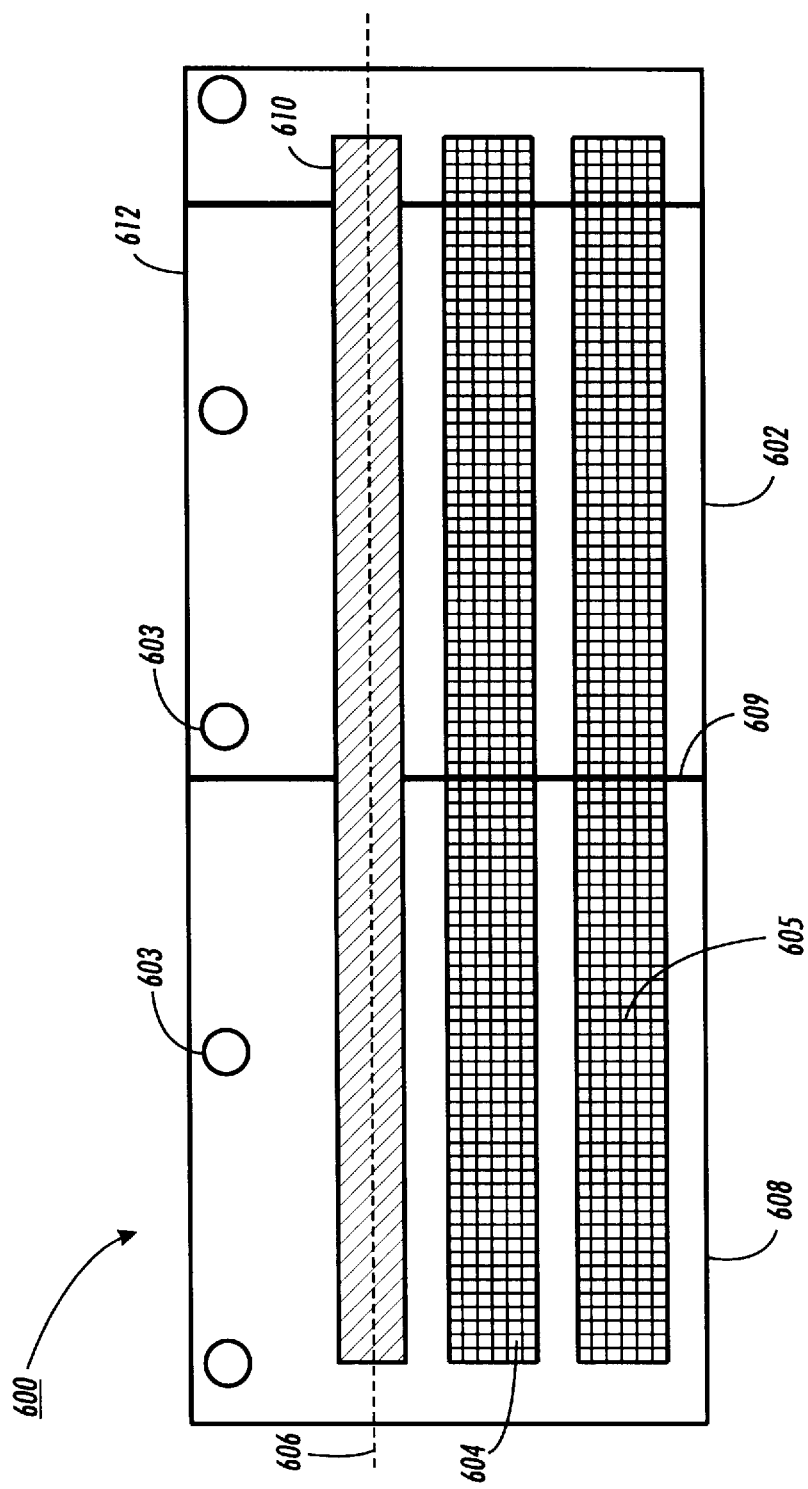
FIG. 13 illustrates the opposite surface of a working substrate that has been joined together according to the joining process of the present invention.

FIGS. 13, 14, 15 and 16 illustrate various aspects of the joining process of the present invention. FIG. 13 shows a front view of the opposite (back) surface 601 of a unitary working substrate 600 made of sections 602 and 608 joined at their abutting lateral edges to form gap, or joint, 609. Surface 601 also includes two sets 604 and 605 of conductive pads. Unitary substrate 600 also now shows tooling openings 603 that are omitted from working substrate 400 in FIG. 10. Stiffening member 610 extends lengthwise across surface 601 a sufficient amount to span all of the gaps of the joined substrate and to provide the necessary stiffness and rigidity needed by joined working substrate 400. Stiffening member 610 is positioned in a middle region of surface 601 between the two sets 604 and 605 of rear surface conductive pads and the top edge 612.

Figure 14:
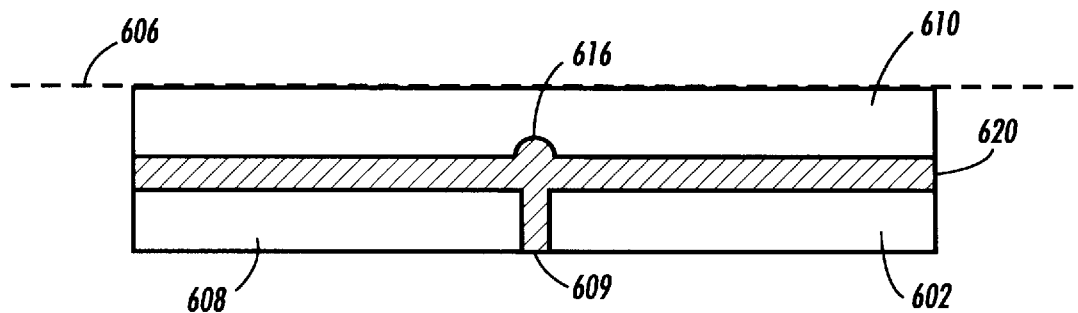
FIG. 14 is a diagrammatic side view of the working substrate of FIG. 13 taken at cut line 606, showing a first embodiment of the present invention.
Figure 15:
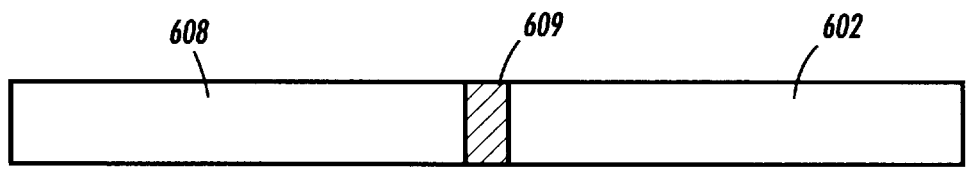
FIG. 15 is a diagrammatic bottom view of a portion of the working substrate of FIG. 13.

FIG. 14 shows the interior layered view of opposite surface 601, taken at line 606 through stiffening member 610 and both surfaces of substrate 600. Layer 620 of joining material lies between stiffening member 610 and substrate sections 608 and 602. Gap 609 is also made of joining material. FIG. 15 is a view of the bottom edge of unitary substrate 600, showing individual substrate sections 602 and 608 with gap 609 filled with joining material in between.

Figure 16:
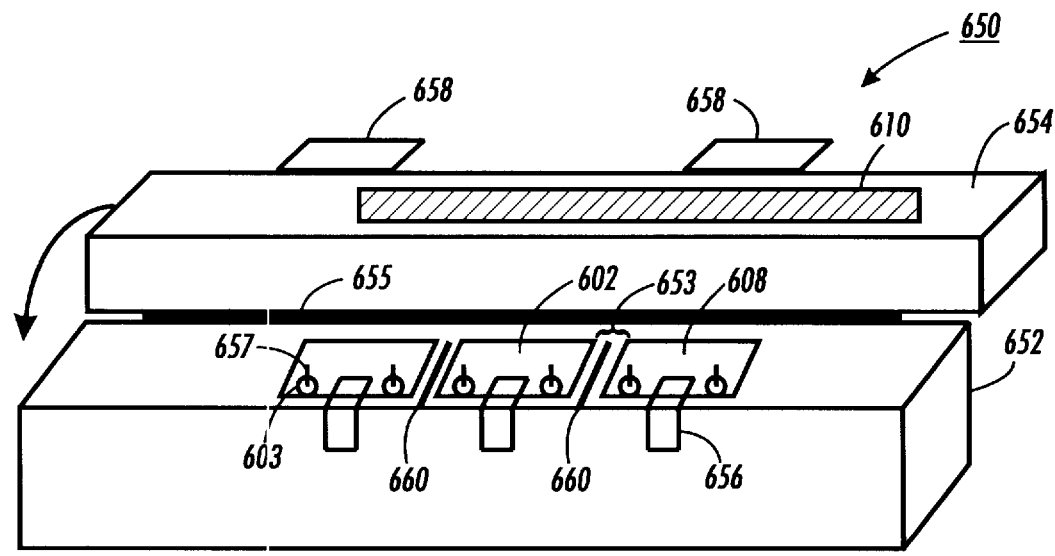
FIG. 16 is a front perspective view of an apparatus suitable for joining working substrates into a unitary working substrate, according to the method of the present invention.

FIG. 16 shows a tooling fixture 650 that may be used to assemble working substrate sections into a unitary working substrate for stitching the conductors thereto. Fixture 650 includes platform 652 for securing the working substrate sections thereto. Fixture 650 also includes holding member 654 for holding stiffening member 610 which is shown mounted thereon. Member 654 is capable of radial motion around connecting mechanism 655, which may be a hinge or the like, so as to bring stiffening member 610 mounted on member 654 in contact with the working substrate sections on platform 652. Handles 658 are shown as one way to bring member 654 in contact with substrate sections 602 and 608 mounted on platform 652 by manual lifting. Platform 652 further includes a rubber sealing mechanism 660 mounted on its surface at each position where two sections will be joined. Sealing mechanism 660 prevents the joining material that will be applied to crack 653 and stiffening member 610 from flowing through to the opposite surface of the substrate sections that is in contact with platform 652.

Joining proceeds as follows: substrate sections 602 and 608 are placed on platform 652 by fitting mounting holes 603 in each substrate section over mounting pegs 657 secured to platform 652 in a manner that leaves a space or crack 653 at the abutting lateral edges between the two sections. When properly seated, each space 653 formed between the lateral edges of two adjacent sections is fitted over a rubber sealing mechanism 660. The sections are then secured to platform 652 by a suitable type of clamping mechanism, as illustrated, for example, by clamp 656. Note that, for generality, sections 602 and 608 illustrated in FIGS. 13 and 16 show straight abutting lateral edges, and do not show the detail of the step-like edges that is shown for sections 402, 404 and 406 in FIGS. 8 and 10. However, it is understood that the joining method of the present invention may be used to join lateral edges having any shape or contour.

Stiffening member 610 is mounted to holder 654. Stiffening member may be made of any material that provides the requisite rigidity and strength to the joined substrate sections. Fiberglass is an example of a suitable material for stiffening member 610. Several drops of an adhesive material, such as, for example, epoxy, may optionally be flowed into each crack between substrate sections seated on platform 652. Adhesive material is then applied to the visible top surface of stiffening member 610, and member 610 is then brought into contact with substrate sections 602 and 608 positioned on platform 652 by lifting and rotating member 654 of fixture 650 and pressing it into contact with the substrate sections mounted on platform 652. Some of the adhesive material applied to the first surface of stiffening member 610 flows into the cracks between the substrate sections, and the adhesive material is allowed to dry to a hardened or cured state.

It is important for forming the gaps at the abutting lateral edges of the substrate sections that the adhesive material not be forced through the cracks between a pair of substrate edges, but rather be allowed to flow the length of each crack. Stiffening member 610 may have notches such as notch 616 in FIG. 14 that extend laterally across stiffening member 610 at every location of a gap between sections; a notch is a trough-like depression in the surface of the stiffening member and allows excess joining material to flow along the area provided by the notch as joining material fills the crack between adjacent edges during the pressing step. In addition, to further prevent contamination of the conductive pads by the joining material, mylar tape may be applied to the cracks on the opposite, or front, surface of the substrate sections to prevent the joining material from seeping through the cracks between the sections and flowing onto the front surface.

Figure 17:
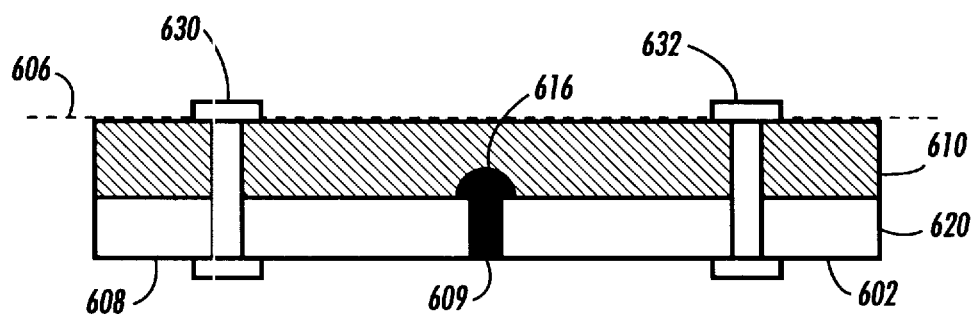
FIG. 17 is a diagrammatic side view of the working substrate of FIG. 13 taken at cut line 606, showing a second embodiment of the present invention.

It will be appreciated by those of skill in the art that a variety of joining materials may be suitable for securing stiffening member 610 to the substrate sections. Stiffening member 610 may be made of metal and be mechanically secured or constrained to substrate sections by pop riveting or by a welding or other suitable bonding process. FIG. 17 shows the interior layered view of opposite surface 601, taken at line 606 through stiffening member 610 and both surfaces of substrate 600, the same view as shown in FIG. 14. FIG. 17 shows fastening members 630 and 632 securing stiffening member 610 to unitary substrate 600, instead of an adhesive layer. In the embodiment of FIG. 17, adhesive material is applied directly to the gap formed between the abutting lateral edges, and not to stiffening member 610. A variety of other types of adhesive material may be used in place of epoxy.

It will be further appreciated by those of skill in the art that the joining method of the present invention is useful in any type of application that shares these three functional requirements for joining substrates: The substrate sections must produce a unitary substrate member with sufficient rigidity and strength to maintain the substrate sections in a joined position during a subsequent processing operation on the joined substrate and thereafter when a completed assembly composed of joined substrate sections is installed as a component of another apparatus. Secondly, if components are formed on the substrate prior to joining, the integrity of those components must remain intact and uncontaminated during the joining process in a manner that would permit the subsequent operation to successfully use the components. Thirdly, the gap, or joint, between the joined lateral edges of two substrate sections must both be of sufficient strength for the intended purpose of the joined substrate and have a width controllable within a range of widths that comprise an acceptable tolerance allowed for a distance between two adjacent components that occur at the joint.

While the present invention has been described in conjunction with one or more specific embodiments, this description is not intended to limit the invention in any way. Accordingly, the invention as described herein is intended to embrace all modifications and variations that are apparent to those skilled in the art and that fall within the scope of the appended claims.

What is claimed:

1. A method for joining first and second rigid substrates at abutting lateral edges to form a unitary rigid writing head substrate construction, each substrate having an elongated array of conductive pads thereon which conductive pads are accurately spaced apart by a first fixed distance, said method comprising:

removably mounting first and second rigid substrates in fixed positions on a first working surface; the first rigid substrate being spaced apart from the second rigid substrate on the working surface by a predetermined second fixed distance between abutting lateral edges thereof, the predetermined second fixed distance maintaining the first fixed distance between adjacent conductive pads on said first and second rigid substrates, and the predetermined second fixed distance forming a gap;

applying a hardenable adhesive material to a first surface of an elongated stiffening member; the elongated stiffening member having a length sufficient to span across the gap formed between the abutting lateral edges and at least a portion of each rigid substrate adjacent thereto;

bringing the first surface of the stiffening member into contact with the first and second rigid substrates mounted on the first working surface; the elongated stiffening member being positioned with respect to the first and second rigid substrates so as to span the gap formed between the abutting lateral edges and the portion of each rigid substrate adjacent thereto;

flowing a portion of the hardenable adhesive material applied to the first surface of the elongated stiffening member into the gap formed between the abutting lateral edges when the elongated stiffening member is brought into contact with the first and second rigid substrates; and drying the hardenable adhesive material to a solid; the elongated stiffening member being permanently affixed to the first and second rigid substrates; the hardenable adhesive material forming a surface at the gap between the abutting lateral edges; the surface connecting the first and second rigid substrates into the unitary rigid writing head substrate construction.

2. The method for joining first and second rigid substrates at abutting lateral edges according to claim 1 wherein the elongated stiffening member is removably mounted to a second working surface; and wherein bringing the elongated stiffening member into contact with the first and second rigid substrates includes moving the second working surface with the elongated stiffening member mounted thereon so as to bring the elongated stiffening member into contact with the first and second rigid substrates.

3. The method for joining first and second rigid substrates at abutting lateral edges according to claim 1 wherein the first working surface has a rubber strip attached laterally thereto; and wherein mounting the first and second rigid substrates on the first working surface includes positioning each rigid substrate on the first working surface such that the gap formed between the abutting lateral edges thereof occurs at the position of the rubber strip when the elongated stiffening member is brought into contact with the first and second rigid substrates; the rubber strip functioning as a seal to prevent the hardenable adhesive material from flowing under the first and second rigid substrates to a nonvisible surface thereof.

4. The method for joining first and second rigid substrates at abutting lateral edges according to claim 1 wherein the elongated stiffening member includes a trough-like depression in the first surface thereof extending laterally across the elongated stiffening member; wherein the elongated stiffening member is further positioned with respect to the first and second rigid substrates such that the trough-like depression is positioned at the gap formed between the abutting lateral edges when the elongated stiffening member is brought into contact with the first and second rigid substrates; and wherein the hardenable adhesive material flows into the trough-like depression.

5. The method for joining first and second rigid substrates at abutting lateral edges according to claim 1 wherein the abutting lateral edges are straight edges.

6. The method for joining first and second rigid substrates at abutting lateral edges according to claim 1 wherein the abutting lateral edges are non-straight edges.

7. The method for joining first and second rigid substrates at abutting lateral edges according to claim 6 wherein the abutting lateral edges each have a step-like contour.

* * * * *